United States Patent [19]
Hwang

[11] Patent Number: 6,097,437
[45] Date of Patent: Aug. 1, 2000

[54] FORMAT CONVERTER

[75] Inventor: Ho-Dae Hwang, Seoul, Rep. of Korea

[73] Assignee: SamSung Electronics Co., Ltd., Kyungki-do, Rep. of Korea

[21] Appl. No.: 08/992,954

[22] Filed: Dec. 18, 1997

[30] Foreign Application Priority Data

Dec. 18, 1996 [KR] Rep. of Korea ................. 96-67468

[51] Int. Cl.[7] .............. H04N 7/01; H04N 3/27; H04N 5/46; H03L 7/00
[52] U.S. Cl. ............ 348/441; 348/441; 348/445; 348/552; 348/554; 345/132; 345/154
[58] Field of Search .................. 348/441, 445, 348/458, 459, 552, 542, 554, 555, 556, 913, 497, 498; 345/132, 154

[56] References Cited

U.S. PATENT DOCUMENTS

| | | | |
|---|---|---|---|
| 5,585,864 | 12/1996 | Takeuchi | 348/719 |
| 5,677,741 | 10/1997 | Yui | 348/649 |
| 5,812,210 | 9/1998 | Arai et al. | 348/555 |
| 5,838,381 | 11/1998 | Kasahara et al. | 348/458 |
| 5,870,073 | 2/1999 | Kitou et al. | 345/132 |
| 5,874,937 | 2/1999 | Kesatoshi | 345/127 |
| 5,912,711 | 6/1999 | Lin et al. | 348/446 |
| 5,933,196 | 8/1999 | Hatano | 348/441 |

*Primary Examiner*—John K. Peng
*Assistant Examiner*—Paulos Natnael
*Attorney, Agent, or Firm*—Robert E. Bushnell, Esq.

[57] ABSTRACT

A format converter includes: a microcomputer for receiving horizontal and vertical synchronizing signals from a host, determining a video mode, and generating data that indicates the number of dots per a period of a horizontal output signal; a W-PLL and time generator for receiving the data from the microcomputer, and generating a write clock signal; an R-PLL and time generator for receiving the data and the horizontal synchronizing signal respectively generated by the microcomputer and the host, and generating a read clock signal; an AD converting section for sampling an analog picture signal received from the host according to the write clock signal of the W-PLL and time generator, and converting it to a digital picture signal; and a format converting section for storing the picture signal received from the AD converter according to the period of the write clock signal of the W-PLL and time generator, and converting the format of the stored picture signal according to the read clock signal received from the R-PLL and time generator.

11 Claims, 5 Drawing Sheets

SVGA(800 X 600)

XGA(1024 X 768)

EWS(1280 X 1024)

FORMAT CONVERTER

CLAIM OF PRIORITY

This application makes reference to, incorporates the same herein, and claims all benefits accruing under 35 U.S.C §119 from an application entitled Format Converter earlier filed in the Korean Industrial Property Office on Dec. 18, 1997, and there duly assigned Serial No. 96-67468 by that Office.

BACKGROUND OF THE INVENTION

1. Field of the Invention

The present invention relates to a format converter and, more particularly, a format converter for displaying RGB picture signals, having different video modes, received from a fixed dimensional display device.

2. Discussion of Related Art

An excessive power consumption is generally attended on the display monitor having a CRT (Cathode Ray Tube) and widely used to display pictures applied from a computer's main body with a high voltage. The display monitor having great volume due to the CRT is hard to be carried or moved about. To overcome this problem with the conventional display monitor, a TFT (Thin Film Transistor) LCD fabricated in a similar manner as semiconductors has been developed and now is generally termed FPD (Flat Panel Display).

Various types of FPD such as PDP (Plasma Display Panel), LCD (Liquid Crystal Display), and LEDD (Light Emitting Diode Display) have been developed for common uses. Out of these FPDs, the latest one is the LCD device that is currently used as a portable monitor in a notebook computer. Some LCD devices are greatly developed to be of such a size as to display pictures through the screen of a common television.

Below is a description of the construction of an LCD monitor circuit that is most widely used as an FPD monitor, with reference to FIG. 1. Referring to FIG. 1, a PC 100 includes a CPU 110 for receiving and processing a keyboard signal input by a user, and for generating data according to the processed result, and includes a video card 120 for receiving the data generated by CPU 110, processing it as a RGB video signal, and outputting a horizontal synchronous signal H-SYNC and a vertical synchronous signal V-SYNC for synchronizing the video signal.

A LCD monitor 200 receiving the RGB video signal, horizontal and vertical synchronous signals H-SYNC and V-SYNC from video card 120 in PC 100 includes: an amplifier 201 for receiving the RGB video signal from video card 120, and amplifying it; a first analog/digital converter (A/D converter) 202 for converting the analog RGB video signal output from amplifier 201 to a digital video signal; a synchronous signal detector 203 for separately detecting horizontal and vertical synchronous signals W/V-SYNC output from video card 120; a first phase locked loop (PLL) 204 for receiving horizontal and vertical synchronous signals H/V-SYNC detected by synchronous signal detector 203 and generating a clock frequency according to the horizontal and vertical synchronous signals; a microcomputer 205 which contains a digital/analog converter (D/A converter) for converting a digital signal to an analog signal, and generates on screen display (OSD) data; an OSD unit 206 for receiving the OSD data from microcomputer 205, and outputting the OSD data as an OSD signal; a second A/D converter 207 for receiving the OSD signal from OSD unit 206, and converting the OSD signal to a digital signal; a multiplexer 208 for receiving the OSD signal from second A/D converter 207 and RGB video signal from first A/D converter 202, and selectively outputting them; a first gate array 209 for setting output timing of the video signal and OSD signal selectively output from multiplexer 208; a second gate array 210 for storing and converting the RGB video signal output from first gate array 209; and a LCD panel 211 for receiving the video signal from second gate array 210, and displaying it.

The operation of the aforementioned conventional LCD monitor is explained below. When a user inputs data into PC 100 in order to execute a program, CPU 110 executes the program according to the data, and outputs video data according to the executed result to video card 120. Video card 120 processes the video data to generate a video signal. Video card 120 also generates horizontal and vertical synchronous signals HV-SYNC for synchronizing the RGB video signal. The video signal is sent from video card 120 to amplifier 201 which amplifies the video signal. The amplified video signal is an analog signal and is converted into a digital RGB video signal by first A/D converter 202, and the digital video signal is sent to multiplexer 208.

Synchronous signal detector 203 detects horizontal and vertical signals H/II-SYNC for synchronizing the video signal output from video card 120 in PC 100, and sends the detected signals to PLL 204. PLL 204 outputs a predetermined clock frequency using the horizontal and vertical synchronous signals. The clock frequency is applied to A/D converter 202. The analog RGB video signal is sampled by A/D converter 202 according to the clock frequency, and the sampled video signal, i.e., the digital RGB video signal, is sent to multiplexer 208.

Microcomputer 205 containing an OSD control program and, in response to a received OSD control signal (not shown), generates the OSD signal according to the OSD control signal. The OSD signal is an analog signal and is converted into a digital signal by second A/D converter 207.

Multiplexer 208 receives the digital OSD signal output from second A/D converter 207, and digital RGB video signal output from first A/D converter 203. The digital OSD signal and digital RGB video signal are selectively output according to a selection signal (not shown) applied to multiplexer 208. For example, when the user uses control buttons (not shown) of LCD monitor 200 in order to display the OSD picture, an OSD selection signal from the control buttons of LCD monitor 200 is output through microcomputer 205 and OSD unit 206. The OSD selection signal is converted into a digital signal by second A/D converter 207, and sent to multiplexer 208 which selectively outputs the OSD signal according to the OSD selection signal.

When the OSD selection signal is not applied to multiplexer 208, multiplexer 208 outputs the digital RGB video signal applied from first A/D converter 203. The digital RGB video signal and digital OSD signal selectively output from multiplexer 208 are sent to first gate array 209. First gate array 209 receives the horizontal and vertical synchronous signals from PLL 204, and sets the output timing according to the horizontal and vertical synchronous signals. When the OSD function is employed, first gate array 209 outputs the digital OSD signal instead of the digital RGB video signal as a predetermined position of the LCD picture, using the horizontal and vertical synchronous signals.

Peak-to-peak voltage of the video signal generated from video card 120 is 0.7Vpp while peak-to-peak voltage of the OSD signal output from OSD unit 206 is 5Vpp. Thus, when multiplexer 208 switches the digital RGB video signal and the digital OSD signal, the signal processing becomes impossible because they are of different voltage values. To solve this, the peak-to-peak voltage of the video signal is amplified by amplifier 201 to 5Vpp.

The output timing of the digital RGB video signal selectively output by multiplexer 208 is controlled by first gate array 209. The digital RGB video signal output from first gate array 209 is stored and converted by second gate array 210, and then sent to LCD panel 211 which displays the digital RGB video signal. The resolution of an LCD monitor on which the RGB picture signals are displayed can be 640×480 for the VGA (Video Graphics Array) mode, 800× 600 for the SVGA (Super Video Graphics Array) mode, 1024×768 for the XGA (Extended Graphics Array) mode, or 1280×1024 for the EWS mode. The resolution of the SVGA (800×600) mode means that the LCD monitor contains 800 pixels on the horizontal line and 600 pixels on the vertical line.

The conventional LCD monitor picture is further explained below with reference to the attached drawings. FIGS. 2A–2C show display pictures of a SVGA LCD monitor when video signals having different resolutions are input thereto. FIG. 2A illustrates the display of a picture according to the basic mode set in the SVGA LCD monitor, and in FIG. 2B the dotted lines illustrate a picture of a video signal having the XGAC (1024×768) video mode applied to the SVGA LCD monitor. In FIG. 2B, the object is displayed larger than the screen size can accommodate. In FIG. 2C the dotted lines illustrate a picture of a video signal in EWS (1280×1024) video mode applied to the SVGA LCD monitor. In FIG. 2C, the object is displayed even larger than the screen size can accommodate. Thus, the user cannot see a portion of the picture, which is displayed on the region beyond the monitor picture.

As described above, the prior art LCD monitor can be operated only in a single display mode of VGA, SVGA, XGA, or the like so that the object in another mode different from the display mode of the LCD monitor will appear smaller or larger than desired.

SUMMARY OF THE INVENTION

Accordingly, the present invention is directed to a format converter that substantially obviates one or more of the problems due to limitations and disadvantages of the related art.

An object of the present invention is to provide a format converter for displaying RGB picture signals of different video modes by converting the format of the video mode to an appropriate one.

To achieve these and other advantages and in accordance with the purpose of the present invention, as embodied and broadly described, a format converter includes: a microcomputer for receiving horizontal and vertical synchronizing signals from a host, determining a video mode, and generating data that indicates the number of dots per a period of a horizontal output signal; a W-PLL and time generator for receiving the data from the microcomputer, and generating a write clock signal; an R-PLL and time generator for receiving the data and the horizontal synchronizing signal respectively generated by the microcomputer and the host, and generating a read clock signal; an AD converting section for sampling an analog picture signal received from the host according to the write clock signal of the W-PLL and time generator, and converting it to a digital picture signal; and a format converting section for storing the picture signal received from the AD converting section according to the period of the write clock signal of the W-PLL and time generator, and converting the format of the stored picture signal according to the read clock signal received from the R-PLL and time generator.

It is to be understood that both the foregoing general description and the following detailed description are exemplary and explanatory and are intended to provide further explanation of the invention as claimed.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE ATTACHED DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein:

DETAILED DESCRIPTION OF PREFERRED EMBODIMENT

Reference will now be made in detail to the preferred embodiments of the present invention, examples of which are illustrated in the accompanying drawings.

Figure 1:
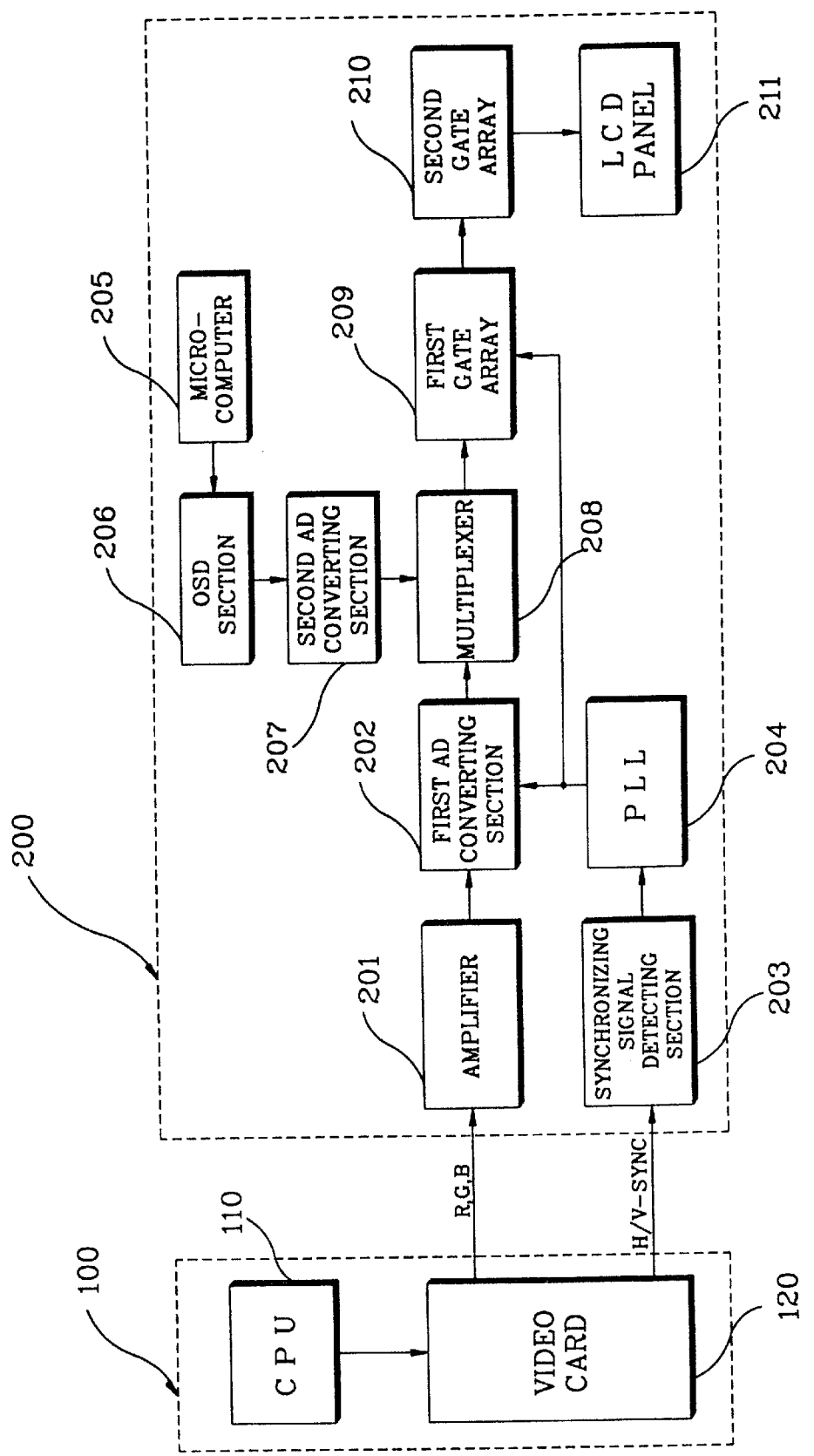
FIG. 1 is a block diagram of a conventional LCD monitor.
Figure 2A:
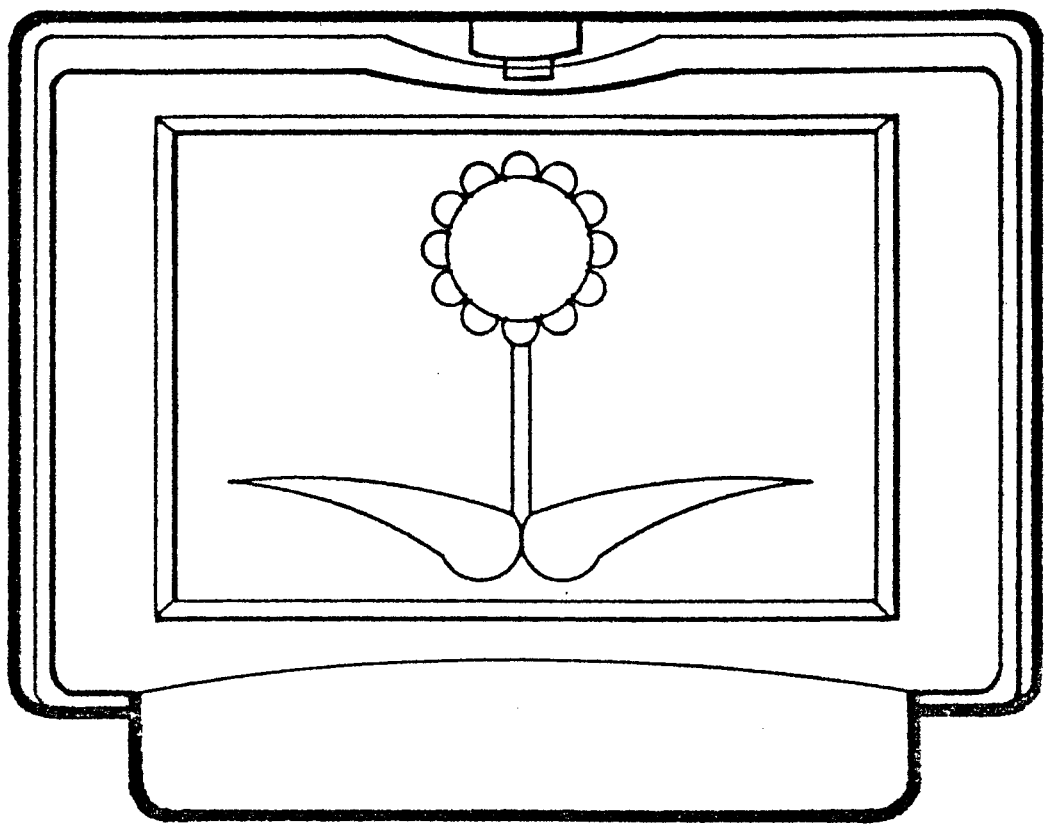
FIGS. 2A–2C illustrate an image displayed on a prior art SVGA LCD monitor wherein the displayed image corresponds to video signals having different resolutions.
Figure 2B:
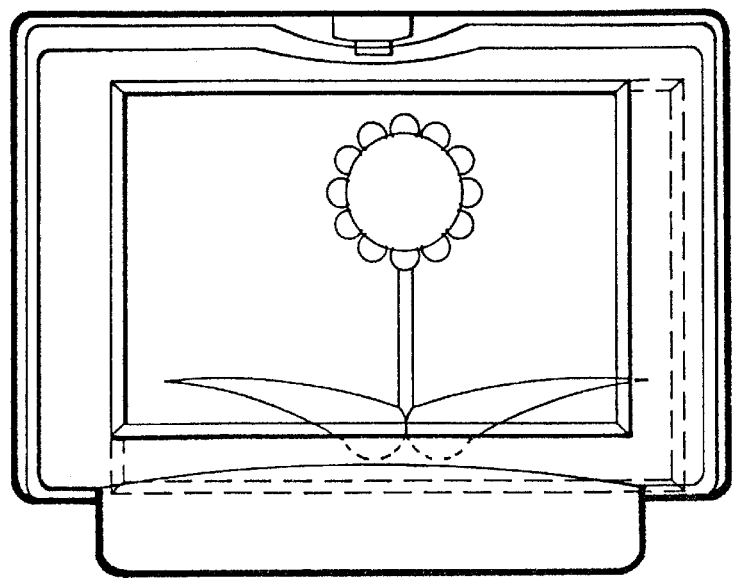
Figure 2C:
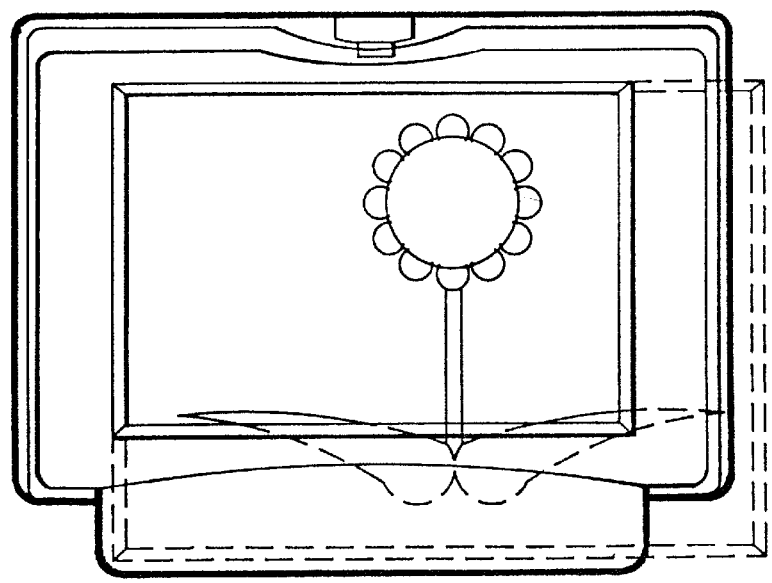
Figure 3:
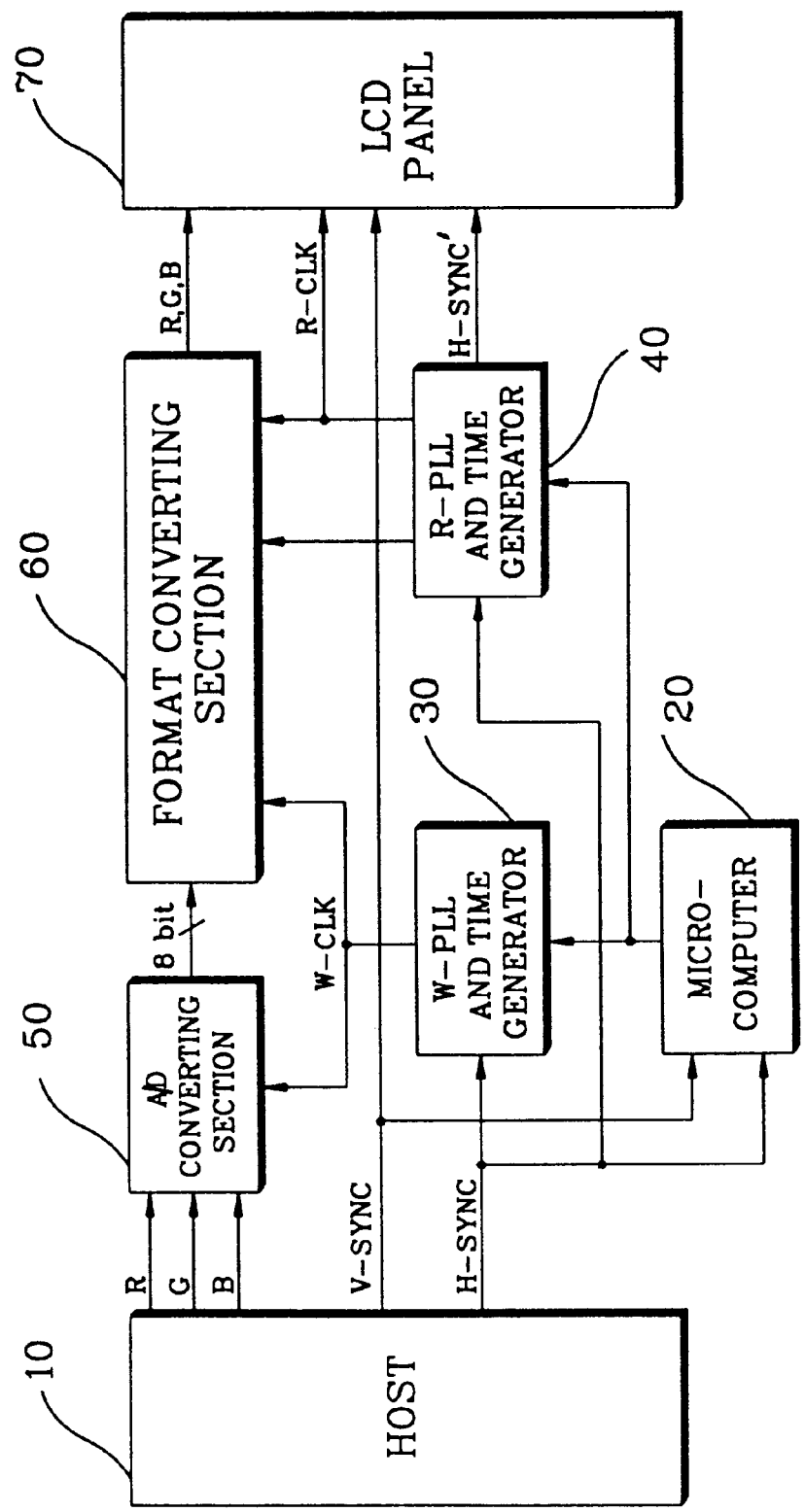
FIG. 3 is a block diagram of an internal LCD circuit in combination with a format converter according to the present invention.

FIG. 3 is a block diagram of an internal LCD circuit in combination with a format converter of the present invention. As shown in FIG. 3, the LCD circuit comprises: a host 10 for generating RGB picture signals, and horizontal and vertical synchronizing signals H-SYNC and V-SYNC to synchronize the RGB picture signals; a microcomputer 20 receiving the horizontal and vertical synchronizing signals H-SYNC and V-SYNC from the host 10, determining a video mode, and generating data that indicates the number of dots per a period of the horizontal output signal according to the determined video mode; a write phase lock loop (W-PLL) and time generator 30 receiving the data from the microcomputer 20, and generating a write clock signal W-CLK; an read phase lock loop (R-PLL) and time generator 40 receiving the data of the microcomputer 20 and the horizontal synchronizing signal H-SYNC of the host 10, and generating a read clock signal R-CLK and a read horizontal synchronizing signal H-SYNC'; an A/D converting section 50 for sampling the analog RGB picture signals received from the host 10 according to the write clock signal W-CLK from the W-PLL and time generator 30, and converting them to digital RGB picture signals; a format converting section 60 for storing the digital RGB picture signals transferred from the AD converting section 50 according to the period of the write clock signal W-CLK received from the W-PLL and time generator 30, and converting the formats of the stored RGB picture signals according to the read clock signal R-CLK received from the R-PLL and time generator 40; and an LCD panel 70 for displaying the RGB picture signals according to the vertical synchronizing signal V-SYNC received from the host 10, and the read clock signal R-CLK and the horizontal synchronizing signal H-SYNC' that are transferred from the R-PLL and time generator 40.

The operation of the LCD circuit will be described below. Host 10 generates the RGB picture signals according to the result of a program execution, and horizontal and vertical synchronizing signals H-SYNC and V-SYNC for synchronizing the RGB picture signals. The horizontal and vertical synchronizing signals H-SYNC and V-SYNC are sent to microcomputer 20 in order to determine a video mode. Microcomputer 20 generates data that indicates the number of dots per a horizontal line period according to determined video mode.

On receiving the output of microcomputer 20, W-PLL and time generator 30 receiving the horizontal synchronizing signal H-SYNC from the host 10, and having a predetermined oscillating frequency, generates and outputs write clock signal W-CLK according to the frequency to A/D converting section 50. AID converting section 50 performs a sampling of the analog RGB picture signals received from host 10 into digital RGB picture signals according to write clock signal W-CLK transferred from the W-PLL and time generator 30. The output of A/D converting section 50 is applied to format converting section 60.

Format converting section 60 stores the digital RGB picture signals according to the write and read clock signals respectively transferred from W-PLL and time generator 30 and R-PLL and time generator 40, and converts the format of the RGB picture signals as will be explained below. For example, when a video mode received from host 10 is the VGA mode (640×480) and a target mode to be converted is the XGA mode (1024×768), the formats are converted as follows so as to display the RGB picture signals fully on the screen of the LCD panel 70.

A 5×5 format for a pixel in the VGA mode (640×480), to be changed into the XGA mode (1024×768), has to be converted to the 8×8 format. To convert the format of a pixel from 5×5 to 8×8, each element of a 9×9 matrix must be calculated from a 6×6 matrix. From the 6×6 matrix given by $$M_{6\times6} = \begin{bmatrix} a_{00} & a_{01} & a_{02} & a_{03} & a_{04} & a_{05} \\ a_{10} & a_{11} & a_{12} & a_{13} & a_{14} & a_{15} \\ a_{20} & a_{21} & a_{22} & a_{23} & a_{23} & a_{23} \\ a_{30} & a_{31} & a_{32} & a_{33} & a_{34} & a_{35} \\ a_{40} & a_{41} & a_{42} & a_{43} & a_{44} & a_{45} \\ a_{50} & a_{51} & a_{52} & a_{53} & a_{54} & a_{55} \end{bmatrix},$$

the elements $a'_{11}$ to $a'_{88}$ of the 9×9 matrix are calculated as follows:

$a'_{11}=[(3/8)\times((3/8)\times a_{00}+(5/8)\times a_{01})]+[(5/8)\times((3/8)\times a_{10}+(5/8)\times a_{11})]$ $a'_{12}=[(3/8)\times((6/8)\times a_{01}+(2/8)\times a_{02})]+[(5/8)\times((6/8)\times a_{11}+(2/8)\times a_{12})]$ $a'_{13}=[(3/8)\times((1/8)\times a_{01}+(7/8)\times a_{02})]+[(5/8)\times((1/8)\times a_{11}+(7/8)\times a_{12})]$ $a'_{14}=[(3/8)\times((4/8)\times a_{02}+(4/8)\times a_{03})]+[(5/8)\times((4/8)\times a_{12}+(4/8)\times a_{13})]$ $a'_{15}=[(3/8)\times((7/8)\times a_{03}+(1/8)\times a_{04})]+[(5/8)\times((7/8)\times a_{13}+(1/8)\times a_{14})]$ $a'_{16}=[(3/8)\times((2/8)\times a_{03}+(6/8)\times a_{04})]+[(5/8)\times((2/8)\times a_{13}+(6/8)\times a_{14})]$ $a'_{17}=[(3/8)\times((5/8)\times a_{04}+(3/8)\times a_{05})]+[(5/8)\times((5/8)\times a_{14}+(3/8)\times a_{15})]$ $a'_{18}=(3/8)\times a_{05}+5/8)\times a_{15}$ The factors of the 9×9 matrix are values converted in proportion to the distance ratio from the 6×6 matrix. The other elements $a'_{21}$ to $a'_{88}$ are calculated in the same manner as the elements $a'_{11}$ to $a'_{18}$, thus completing the 9×9 matrix given by:

$$M_{9\times9} = \begin{bmatrix} a'_{00} & a'_{01} & a'_{02} & a'_{03} & a'_{04} & a'_{05} & a'_{06} & a'_{07} & a'_{08} \\ a'_{10} & a'_{11} & a'_{12} & a'_{13} & a'_{14} & a'_{15} & a'_{16} & a'_{17} & a'_{18} \\ a'_{20} & a'_{21} & a'_{22} & a'_{23} & a'_{24} & a'_{25} & a'_{26} & a'_{27} & a'_{28} \\ a'_{30} & a'_{31} & a'_{32} & a'_{33} & a'_{34} & a'_{35} & a'_{36} & a'_{37} & a'_{38} \\ a'_{40} & a'_{41} & a'_{42} & a'_{43} & a'_{44} & a'_{45} & a'_{46} & a'_{47} & a'_{48} \\ a'_{50} & a'_{51} & a'_{52} & a'_{53} & a'_{54} & a'_{55} & a'_{56} & a'_{57} & a'_{58} \\ a'_{60} & a'_{61} & a'_{62} & a'_{63} & a'_{64} & a'_{65} & a'_{66} & a'_{67} & a'_{68} \\ a'_{70} & a'_{71} & a'_{72} & a'_{73} & a'_{74} & a'_{75} & a'_{76} & a'_{77} & a'_{78} \\ a'_{80} & a'_{81} & a'_{82} & a'_{83} & a'_{84} & a'_{85} & a'_{86} & a'_{87} & a'_{88} \end{bmatrix}$$

If a video mode is the SVGA mode (800×600) with a target XGA mode (1024×764), the 10×10 format for a pixel in the SVGA mode (800×600) must be converted to the 12×12 format in the XGA mode (1024×764).

When a video mode received from the host 10 is the VGA mode (640×480) and a target mode to be converted is the SVGA mode (800×600), from the 5×5 matrix given by:

$$M_{5\times5} = \begin{bmatrix} a_{00} & a_{01} & a_{02} & a_{03} & a_{04} \\ a_{10} & a_{11} & a_{12} & a_{13} & a_{14} \\ a_{20} & a_{21} & a_{22} & a_{23} & a_{24} \\ a_{30} & a_{31} & a_{32} & a_{33} & a_{34} \\ a_{40} & a_{41} & a_{42} & a_{43} & a_{44} \end{bmatrix},$$

the elements $a'_{11}$ to $a'_{55}$ of the 6×6 matrix can be calculated as follows:

$a'_{11}=[(1/5)\times((1/5)\times a_{00}+(4/5)\times a_{01})]+[(4/5)\times((1/5)\times a_{10}+(4/5)\times a_{11})]$ $a'_{12}=[(1/5)\times((2/5)\times a_{01}+(3/5)\times a_{02})]+[(4/5)\times((2/5)\times a_{11}+(3/5)\times a_{12})]$ $a'_{13}=[(1/5)\times((3/5)\times a_{02}+(2/5)\times a_{03})]+[(4/5)\times((3/5)\times a_{12}+(2/5)\times a_{13})]$ $a'_{14}=[(1/5)\times((4/5)\times a_{03}+(1/5)\times a_{04})]+[(4/5)\times((4/5)\times a_{13}+(1/5)\times a_{14})]$ $a'_{15}=(1/5)\times a_{04}+4/5)\times a_{14}$ The factors of the 6×6 matrix are values converted in proportion to the distance ratio from the 5×5 matrix.

The other elements $a'_{21}$ to $a'_{55}$ are calculated in the same manner as the elements $a'_{11}$ to $a'_{15}$, thus completing the 6×6 matrix given by:

$$M_{6\times6} = \begin{bmatrix} a'_{00} & a'_{01} & a'_{02} & a'_{03} & a'_{04} & a'_{05} \\ a'_{10} & a'_{11} & a'_{12} & a'_{13} & a'_{14} & a'_{15} \\ a'_{20} & a'_{21} & a'_{22} & a'_{23} & a'_{24} & a'_{25} \\ a'_{30} & a'_{31} & a'_{32} & a'_{33} & a'_{34} & a'_{35} \\ a'_{40} & a'_{41} & a'_{42} & a'_{43} & a'_{44} & a'_{45} \\ a'_{50} & a'_{51} & a'_{52} & a'_{53} & a'_{54} & a'_{55} \end{bmatrix}$$

Using these matrixes, the format converting section 60 transforms various video modes received from the host 10 into the target video mode, generating the RGB picture signals to the LCD panel 70. The LCD panel 70 converts the formats of the RGB picture signals according to the read clock signal R-CLK and the read horizontal synchronizing signal H-SYNC' received from the R-PLL and time generator 40, and displays the RGB picture signals on the full screen.

Figure 4:
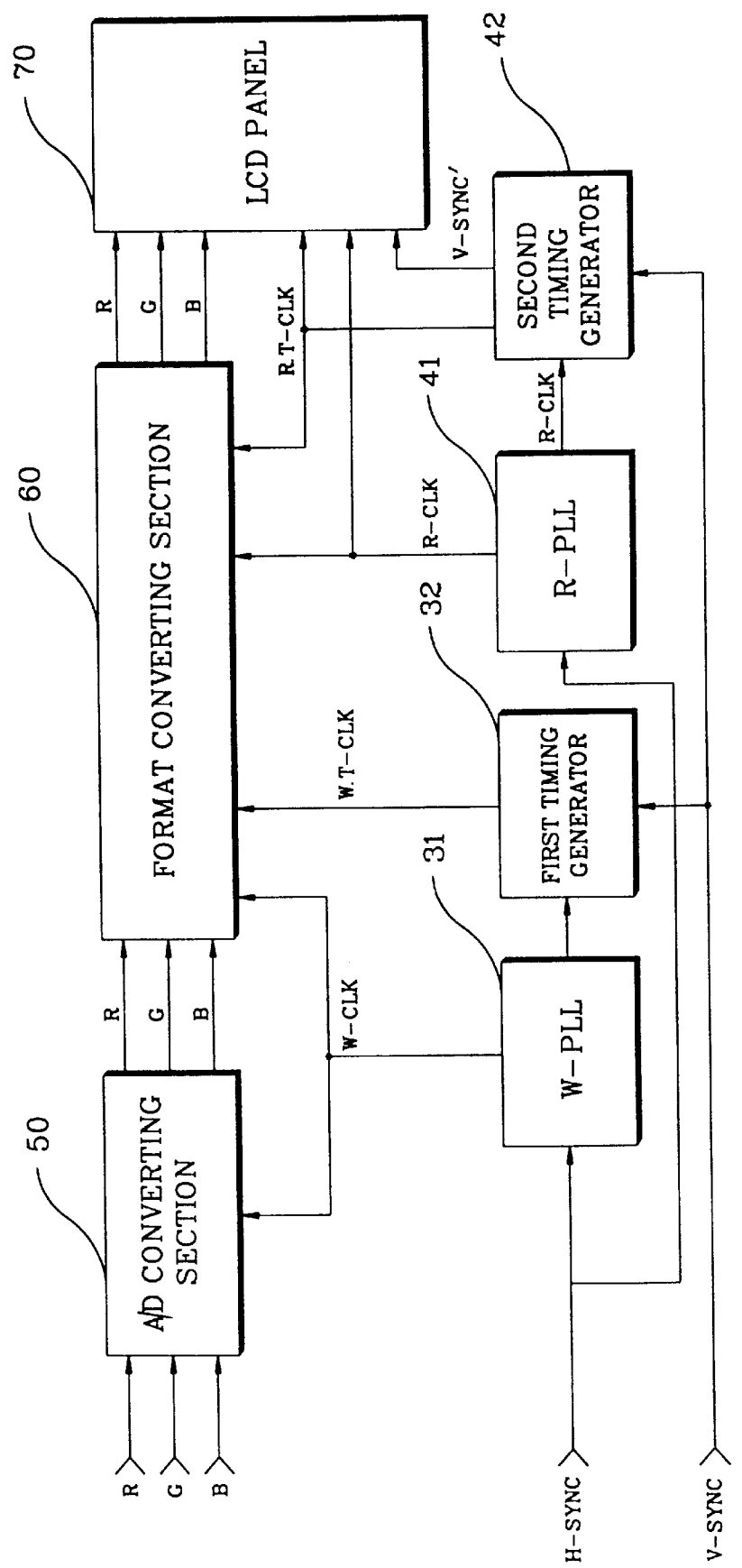
FIG. 4 is a block diagram illustrating an embodiment of the format converter according to the present invention.

FIG. 4 is a block diagram illustrating an embodiment of the format converter according to the present invention. As shown in FIG. 4, the embodiment comprises: a W-PLL 31 for generating a write clock signal W-CLK according to a horizontal synchronizing signal H-SYNC received from host 10 as shown in FIG. 3; a first timing generator 32 receiving the write clock signal W-CLK from the W-PLL 31 and a vertical synchronizing signal V-SYNC from host 10, and generating a write timing clock signal W.T-CLK; an R-PLL 41 receiving the horizontal synchronizing signal H-SYNC from host 10, and generating a read clock signal R-CLK; a second timing generator 42 for generating a read timing clock signal R.T-CLK and a read vertical synchronizing signal V-SYNC' according to the read clock signal R-CLK received from R-PLL 41 and the vertical synchronizing signal V-SYNC from host 10; an A/D converting section 50 for sampling the analog RGB picture signals received from host 10 according to the write clock signal W-CLK of W-PLL 31, and converting them to digital RGB picture signals; a format converting section 60 for storing the digital RGB picture signals receiving from A/D converting section 50 according to the write clock signal W-CLK of W-PLL 31 and write timing clock signal W.T-CLK from first timing generator 32, and converting the formats of the RGB picture signals according to the read clock signal R-CLK received from the R-PLL 41 and the read timing clock signal R.T-CLK from the second timing generator 42; and an LCD panel 70 for synchronizing the RGB picture signals received from format converting section 60 to the read clock signal R-CLK, the read timing clock signal R.T-CLK, and the read vertical synchronizing signal V-SYNC' respectively transferred from the R-PLL 41 and the second timing generator 42, displaying the RGB picture signals.

To describe the operation of the LCD monitor as constructed above, a horizontal synchronizing signal H-SYNC of the host 10 is first transferred to the W-PLL 31, which generates a write clock signal W-CLK to the A/D converting section 50. A/D converting section 50 performs a sampling of the RGB picture signals received from the host 10, and converts them into digital RGB picture signals. First timing generator 32 converts a vertical synchronizing signal V-SYNC transferred from the host 10 to the first timing generator 32 into a write timing clock signal W.T-CLK according to the period of the write clock signal W-CLK.

The format converting section 60 stores the RGB picture signals according to the write timing clock signal W.T-CLK received from the first timing generator 32, converting the formats of the RGB picture signals to the target video mode.

The R-PLL 41 converts the horizontal synchronizing signal H-SYNC of the host 10 to a read clock signal R-CLK, which is sent to the second timing generator 42. The second timing generator 42 generates a read vertical synchronizing signal V-SYNC' and a read timing clock signal R.T-CLK according to the read clock signal R-CLK and the vertical synchronizing signal V-SYNC received from the R-PLL 41.

Receiving the read clock signal R-CLK and the read timing clock signal R.T-CLK respectively from the R-PLL 41 and the second timing generator 42, the format converting section 60 converts the formats of the RGB picture signals. The RGB picture signals of the format converting section 60 are synchronized according to the read clock signal R-CLK, the read timing clock signal R.T-CLK, and the read vertical synchronizing signal V-SYNC' respectively transferred from the R-PLL 41 and the second timing generator 42, and displayed on the LCD panel 70.

As described above, the present invention is characterized by a format converting section that readily converts the RGB picture signals of different video modes generated from the host to those of a wanted video mode.

It will be apparent to those skilled in the art that various modifications and variations can be made in a format converter of the present invention without departing from the spirit or scope of the invention. Thus, it is intended that the present invention cover the modifications and variations of this invention provided they come within the scope of the appended claims and their equivalents

What is claimed is:

1. A format converter, comprising:
   a microcomputer for receiving horizontal and vertical synchronizing signals from a host, determining a video mode, and generating data that indicates a number of dots per horizontal line period;
   a write phase lock loop and time generator for receiving the data from the microcomputer, and generating a write clock signal;
   a read phase lock loop and time generator for receiving the data and the horizontal synchronizing signal respectively generated by the microcomputer and the host, and generating a read clock signal;
   an analog-to-digital converting section for sampling an analog picture signal received from the host in response to said write clock signal to convert the analog picture signal to a digital picture signal; and
   a format converting section for storing the digital picture signal according, to a period of said write clock signal, and for converting a format of the stored digital picture signal according to said read clock signal.

2. The format converter as set forth in claim 1, wherein in order to convert a VGA (640×480) mode video signal to a XGA (1024×768) mode video signal, the format converting section transforms a 6×6 matrix given by:

$$M_{6\times 6} = \begin{bmatrix} a_{00} & a_{01} & a_{02} & a_{03} & a_{04} & a_{05} \\ a_{10} & a_{11} & a_{12} & a_{13} & a_{14} & a_{15} \\ a_{20} & a_{21} & a_{22} & a_{23} & a_{23} & a_{23} \\ a_{30} & a_{31} & a_{32} & a_{33} & a_{34} & a_{35} \\ a_{40} & a_{41} & a_{42} & a_{43} & a_{44} & a_{45} \\ a_{50} & a_{51} & a_{52} & a_{53} & a_{54} & a_{55} \end{bmatrix}$$

into a 9×9 matrix expressed by:

$$M_{9\times 9} = \begin{bmatrix} a'_{00} & a'_{01} & a'_{02} & a'_{03} & a'_{04} & a'_{05} & a'_{06} & a'_{07} & a'_{08} \\ a'_{10} & a'_{11} & a'_{12} & a'_{13} & a'_{14} & a'_{15} & a'_{16} & a'_{17} & a'_{18} \\ a'_{20} & a'_{21} & a'_{22} & a'_{23} & a'_{24} & a'_{25} & a'_{26} & a'_{27} & a'_{28} \\ a'_{30} & a'_{31} & a'_{32} & a'_{33} & a'_{34} & a'_{35} & a'_{36} & a'_{37} & a'_{38} \\ a'_{40} & a'_{41} & a'_{42} & a'_{43} & a'_{44} & a'_{45} & a'_{46} & a'_{47} & a'_{48} \\ a'_{50} & a'_{51} & a'_{52} & a'_{53} & a'_{54} & a'_{55} & a'_{56} & a'_{57} & a'_{58} \\ a'_{60} & a'_{61} & a'_{62} & a'_{63} & a'_{64} & a'_{65} & a'_{66} & a'_{67} & a'_{68} \\ a'_{70} & a'_{71} & a'_{72} & a'_{73} & a'_{74} & a'_{75} & a'_{76} & a'_{77} & a'_{78} \\ a'_{80} & a'_{81} & a'_{82} & a'_{83} & a'_{84} & a'_{85} & a'_{86} & a'_{87} & a'_{88} \end{bmatrix}.$$

3. The format converter as set forth in claim 1, wherein in order to convert a VGA (640×480) mode to an SVGA (800×600) mode, the format converting section transforms a 5×5 matrix given by:

$$M_{5\times5} = \begin{bmatrix} a_{00} & a_{01} & a_{02} & a_{03} & a_{04} \\ a_{10} & a_{11} & a_{12} & a_{13} & a_{14} \\ a_{20} & a_{21} & a_{22} & a_{23} & a_{24} \\ a_{30} & a_{31} & a_{32} & a_{33} & a_{34} \\ a_{40} & a_{41} & a_{42} & a_{43} & a_{44} \end{bmatrix}$$

into a 6×6 matrix expressed by:

$$M_{6\times6} = \begin{bmatrix} a'_{00} & a'_{01} & a'_{02} & a'_{03} & a'_{04} & a'_{05} \\ a'_{10} & a'_{11} & a'_{12} & a'_{13} & a'_{14} & a'_{15} \\ a'_{20} & a'_{21} & a'_{22} & a'_{23} & a'_{24} & a'_{25} \\ a'_{30} & a'_{31} & a'_{32} & a'_{33} & a'_{34} & a'_{35} \\ a'_{40} & a'_{41} & a'_{42} & a'_{43} & a'_{44} & a'_{45} \\ a'_{50} & a'_{51} & a'_{52} & a'_{53} & a'_{54} & a'_{55} \end{bmatrix}.$$

4. A format converter, comprising:

a write phase lock loop for receiving a horizontal synchronizing signal from a host, and generating a write clock signal according to the horizontal synchronizing signal;

a first timing generator for receiving said write clock signal from said write phase lock loop and a vertical synchronizing signal from said host, and for generating a write timing clock signal;

a read phase lock loop for receiving said horizontal synchronizing signal from said host, and for generating a read clock signal;

a second timing generator for receiving said read clock signal from said read phase lock loop and said vertical synchronizing signal transferred from the host, and for generating a read timing clock signal and a read vertical synchronizing signal;

an A/D converting section for sampling an analog picture signal received from said host according to said write clock signal and converting said analog picture signal to a digital picture signal; and a format converting section for storing said digital picture signal received from said analog-to-digital converting section according to said write timing clock signal transferred from said first timing generator, and for converting a format of the digital stored picture signal according to said read clock signal received from said read phase lock loop and the read timing clock signal from said second timing generator.

5. The format converter as set forth in claim 4, wherein in order to convert a VGA (640×480) mode video signal to a XGA (1024×768) mode video signal, the format converting section transforms a 6×6 matrix given by:

$$M_{6\times6} = \begin{bmatrix} a_{00} & a_{01} & a_{02} & a_{03} & a_{04} & a_{05} \\ a_{10} & a_{11} & a_{12} & a_{13} & a_{14} & a_{15} \\ a_{20} & a_{21} & a_{22} & a_{23} & a_{23} & a_{23} \\ a_{30} & a_{31} & a_{32} & a_{33} & a_{34} & a_{35} \\ a_{40} & a_{41} & a_{42} & a_{43} & a_{44} & a_{45} \\ a_{50} & a_{51} & a_{52} & a_{53} & a_{54} & a_{55} \end{bmatrix}$$

into a 9×9 matrix expressed by:

$$M_{9\times9} = \begin{bmatrix} a'_{00} & a'_{01} & a'_{02} & a'_{03} & a'_{04} & a'_{05} & a'_{06} & a'_{07} & a'_{08} \\ a'_{10} & a'_{11} & a'_{12} & a'_{13} & a'_{14} & a'_{15} & a'_{16} & a'_{17} & a'_{18} \\ a'_{20} & a'_{21} & a'_{22} & a'_{23} & a'_{24} & a'_{25} & a'_{26} & a'_{27} & a'_{28} \\ a'_{30} & a'_{31} & a'_{32} & a'_{33} & a'_{34} & a'_{35} & a'_{36} & a'_{37} & a'_{38} \\ a'_{40} & a'_{41} & a'_{42} & a'_{43} & a'_{44} & a'_{45} & a'_{46} & a'_{47} & a'_{48} \\ a'_{50} & a'_{51} & a'_{52} & a'_{53} & a'_{54} & a'_{55} & a'_{56} & a'_{57} & a'_{58} \\ a'_{60} & a'_{61} & a'_{62} & a'_{63} & a'_{64} & a'_{65} & a'_{66} & a'_{67} & a'_{68} \\ a'_{70} & a'_{71} & a'_{72} & a'_{73} & a'_{74} & a'_{75} & a'_{76} & a'_{77} & a'_{78} \\ a'_{80} & a'_{81} & a'_{82} & a'_{83} & a'_{84} & a'_{85} & a'_{86} & a'_{87} & a'_{88} \end{bmatrix}.$$

6. The format converter as set forth in claim 4, wherein in order to convert a VGA (640×480) mode to an SVGA (800×600) mode, the format converting section transforms a 5×5 matrix given by:

$$M_{5\times5} = \begin{bmatrix} a_{00} & a_{01} & a_{02} & a_{03} & a_{04} \\ a_{10} & a_{11} & a_{12} & a_{13} & a_{14} \\ a_{20} & a_{21} & a_{22} & a_{23} & a_{24} \\ a_{30} & a_{31} & a_{32} & a_{33} & a_{34} \\ a_{40} & a_{41} & a_{42} & a_{43} & a_{44} \end{bmatrix}$$

into a 6×6 matrix expressed by:

$$M_{6\times6} = \begin{bmatrix} a'_{00} & a'_{01} & a'_{02} & a'_{03} & a'_{04} & a'_{05} \\ a'_{10} & a'_{11} & a'_{12} & a'_{13} & a'_{14} & a'_{15} \\ a'_{20} & a'_{21} & a'_{22} & a'_{23} & a'_{24} & a'_{25} \\ a'_{30} & a'_{31} & a'_{32} & a'_{33} & a'_{34} & a'_{35} \\ a'_{40} & a'_{41} & a'_{42} & a'_{43} & a'_{44} & a'_{45} \\ a'_{50} & a'_{51} & a'_{52} & a'_{53} & a'_{54} & a'_{55} \end{bmatrix}.$$

7. A method of converting a video format, comprising steps of:

receiving horizontal and vertical synchronizing signals from a host and generating dot clock data indicative of a number of dots per horizontal line period of an analog video signal generated by said host;

generating a write clock signal in response to said horizontal synchronizing signal and said dot clock data;

generating a read clock signal in response to said horizontal synchronizing signal and said dot clock data;

sampling said analog video signal in response to said write clock signal to convert the analog video signal to a digital video signal;

storing the digital video signal in response to said write clock signal; and converting the stored digital video signal from a first format into a second format in response to said read clock signal.

8. The method as set forth in claim 7, wherein said converting step comprises transforming a 6×6 matrix of a VGA (640×480) mode video signal into a 9×9 matrix of a XGA (1024×768) mode video signal.

9. The method as set forth in claim 7, wherein said converting step comprises transforming a 5×5 matrix of a VGA (640×480) mode video signal into a 6×6 matrix of a SVGA (800×600) mode video signal.

10. The method as set forth in claim 7, wherein said converting step comprises transforming a 10×10 matrix of a SVGA (800×600) mode video signal into a 12×12 matrix of a XGA (1024×768) mode video signal.

11. A method of converting a video format, comprising steps of:

generating a write clock signal in response to a horizontal synchronizing signal received from a host;

generating a write timing clock signal in response to said write clock signal and a vertical synchronizing signal received from said host;

generating a read clock signal in response to said horizontal synchronizing signal received from said host;

generating a read timing clock signal and a read vertical synchronizing signal in response to said read clock signal and said vertical synchronizing signal received from said host;

sampling an analog video signal received from said host in response to said write clock signal to convert said analog video signal to a digital video signal; and storing said digital video signal according to said write timing clock signal; and converting a format of the stored digital video signal according to said read clock signal and the read timing clock signal.

* * * * *